United States Patent
Bengston

(10) Patent No.: US 9,650,719 B1
(45) Date of Patent: May 16, 2017

(54) METHOD FOR ELECTROLESS PLATING OF PALLADIUM PHOSPHORUS DIRECTLY ON COPPER, AND A PLATED COMPONENT THEREFROM

(71) Applicant: UYEMURA INTERNATIONAL CORPORATION, Ontario, CA (US)

(72) Inventor: Jon E. Bengston, West Hartford, CT (US)

(73) Assignee: UYEMURA INTERNATIONAL CORPORATION, Ontario, CA (US)

( * ) Notice: Subject to any disclaimer, the term of this patent is extended or adjusted under 35 U.S.C. 154(b) by 0 days.

(21) Appl. No.: 15/423,324

(22) Filed: Feb. 2, 2017

Related U.S. Application Data

(62) Division of application No. 14/819,150, filed on Aug. 5, 2015, now Pat. No. 9,603,258.

(51) Int. Cl.
| | |
|---|---|
| *C23C 18/16* | (2006.01) |
| *C23C 18/44* | (2006.01) |
| *H05K 1/09* | (2006.01) |
| *H05K 3/18* | (2006.01) |

(52) U.S. Cl.
CPC .......... *C23C 18/44* (2013.01); *C23C 18/1637* (2013.01); *H05K 1/09* (2013.01); *H05K 3/187* (2013.01)

(58) Field of Classification Search
CPC . C23C 18/1637; C23C 18/1651; C23C 18/44; C23C 18/54; H05K 1/09; H05K 3/181
USPC ...... 106/1.24, 1.28; 437/99.5, 327, 405, 437
See application file for complete search history.

(56) References Cited

U.S. PATENT DOCUMENTS

| | | |
|---|---|---|
| 4,255,194 A | 3/1981 | Hough |
| 5,292,361 A | 3/1994 | Otsuka |
| 5,882,736 A | 3/1999 | Stein |
| 6,281,090 B1 | 8/2001 | Kukanskis |
| 7,704,307 B2 | 4/2010 | Aiba |
| 8,562,727 B2 | 10/2013 | Watanabe |
| 8,987,910 B2 | 3/2015 | Ozkok et al. |
| 9,401,466 B2 | 7/2016 | Walter |
| 2007/0104929 A1 | 5/2007 | Yim |
| 2010/0071940 A1 | 3/2010 | Ejiri |
| 2010/0199882 A1 | 8/2010 | Kojima |
| 2017/0042040 A1* | 2/2017 | Bengston ............... H05K 3/181 |

* cited by examiner

*Primary Examiner* — Helene Klemanski

(57) ABSTRACT

A solution comprising a palladium compound and a polyaminocarboxylic compound has been found to be suitable as a bath for electroless plating of palladium onto copper. Use of such a solution produces a plated component comprising a copper surface and a palladium plated coating having a thickness of between 0.01 micrometers (μm) and 5 μm. A method for electroless plating of palladium onto a copper surface of a component includes preparing a bath having a palladium compound and a polyaminocarboxylic compound. The copper component is submerged in the bath to plate a palladium layer on the copper surface of the component. The component resulting from the plating method has a palladium layer plated on the copper surface.

16 Claims, 4 Drawing Sheets

METHOD FOR ELECTROLESS PLATING OF PALLADIUM PHOSPHORUS DIRECTLY ON COPPER, AND A PLATED COMPONENT THEREFROM

CROSS REFERENCE TO RELATED APPLICATIONS

This application is a division of application serial number U.S. Ser. No. 14/819,150 filed Aug. 5, 2015 for COMPOSITION AND METHOD FOR ELECTROLESS PLATING OF PALLADIUM PHOSPHORUS ON COPPER, AND A COATED COMPONENT THEREFROM.

BACKGROUND OF THE INVENTION

1. Field of the Invention

The present invention relates to plating palladium on copper and, more particularly, to a method of electroless plating of palladium phosphorus alloy directly onto a copper surface, and the product resulting from the plating method.

2. Description of Related Art

Metal plating is used in many industries for various reasons. For example, metal plating is used in the electronics industry to increase the ability to solder to a base metal, to increase resistance to corrosion, to alter conductivity, and for radiation shielding, among others. Various metals are used for plating and each metal has its own attributes. For example, nickel is relatively easy to plate onto a base metal and is relatively inexpensive; however, it has a relatively low oxidation resistance and malleability (meaning it may have a tendency to crack under stress). On the other hand, gold is relatively oxidation resistant yet is relatively expensive and has a tendency to tarnish from copper diffusion into the gold forming an oxidized layer when plated directly on copper. Palladium is highly corrosion resistant, is relatively easy to solder to, and enables gold wire bonding when used in conjunction with gold; however, it is difficult to plate the phosphorus alloy directly on copper surfaces.

In some situations, multiple materials are plated on a substrate in order to achieve a desired set of qualities. For example, a copper surface may receive a nickel plating with a gold plating on the nickel plating. This combination allows the final coating to have the desirable properties of gold, and the nickel plating blocks the copper diffusion and the resulting tarnish of the gold. However, the combination of gold plating and nickel plating is not typically suitable for gold wire bonding with the exception of gold thicknesses well above 0.1 um, which can undesirably increase the plating costs. Palladium can be plated between the nickel and the gold layers, increasing the suitability of the plating for wire bonding. This process can be relatively expensive and time consuming as it utilizes three distinct materials and plating processes. There are additional drawbacks. For example, nickel plating is traditionally both thick and rigid, making it unsuitable for flexible printed circuit boards (PCBs) as well as when distances between components to be plated are relatively small. Money, time, and real estate costs could be reduced and usability increased by eliminating the nickel plating and plating the palladium phosphorous directly on the copper. However, a suitable method for plating palladium phosphorous directly onto copper is not known in the art.

Electrolytic plating is one available plating method but it is typically unsuitable for electronic components. Plating by electrolytic process requires the base metal (i.e., the copper and a second metal part) to each be submerged into a solution of water soluble metal salts. A current is applied to the base metal and the second metal part, making the base metal a cathode and the second metal part an anode. The electrical current reduces the ionic metal in the solution, forming a solid metal coating on the cathode (the base metal). However, electrolytic plating has a significant drawback—any surface to be coated must be made cathodic. Thus, electrolytic plating is unsuitable for coating any component having multiple insulated surfaces to be plated.

Immersion plating is another plating method used in the art, yet is typically unsuitable for plating palladium directly on copper. Immersion plating includes submerging a base metal into a solution having electrolytes and metal salts. When the base metal is submerged, the electrolytes corrode the surface of the base metal, making the surface electrically cathodic relative to the dissolved metal. The metal salts in the solution are then reduced, forming a metal plate on the base metal. A first limitation with immersion plating is that the plating is limited to a relatively thin layer because as soon as the surface of the base metal is coated, the reaction can no longer occur. Another limitation with immersion plating, especially of palladium onto copper, is that the resulting palladium coating is granular and porous, making it unsuitable for soldering and wire-bonding.

Some attempts have been made for electroless plating (autocatalytic plating) of palladium phosphorus onto copper; however, no consistent or commercially suitable results have yet been obtained. Electroless plating is performed by creating a bath including a metal salt and a reducing agent. When the reducing agent is exposed to a catalyst (typically the surface of the substrate to be plated or a film thereon), the reducing agent donates electrons, causing the metal salt to precipitate on to the surface of the substrate. Accordingly, for electroless plating to work, the surface of the substrate must be catalytic. Nickel, palladium, and cobalt are examples of known catalysts for electroless palladium phosphorus plating. Copper, however, is not a catalyst for palladium plating, and in fact is a catalytic poison, meaning that it effectively prevents the electroless plating reaction.

There is an unfulfilled need for a component that has palladium phosphorus plated directly on a copper surface, a method for suitably plating palladium onto copper, and a bath composition for performing the plating. The inventor has found a solution to this unfulfilled need.

SUMMARY OF THE INVENTION

A solution comprising a palladium compound, hypophosphite and a polyaminocarboxylic compound, such as at least one of an ethylene diamine tetraacetic acid (EDTA) or a derivative thereof, has been found to be suitable as a bath for electroless plating of palladium phosphorus alloy onto surfaces of metals and, in particular, for electroless plating of palladium phosphorus alloy onto copper surfaces.

Use of such a solution produces a plated component comprising a copper surface and a palladium phosphorus plated coating having a thickness of between 0.01 micrometers ($\mu$m) and 5 $\mu$m.

A method for electroless plating of palladium phosphorus onto a copper surface of a component includes preparing a bath having a palladium compound and a polyaminocarboxylic compound, such as at least one of an ethylene diamine tetraacetic acid (EDTA) or a derivative thereof. The copper surface of the component is submerged in the bath to plate a palladium phosphorus layer on the copper surface of the component.

The component resulting from the plating method has palladium phosphorus plated on the copper surface.

BRIEF DESCRIPTION OF THE DRAWINGS

The exact nature of this invention, as well as the objects and advantages thereof, will become readily apparent upon consideration of the following specification in conjunction with the accompanying drawings in which like reference numerals designate like parts throughout the figures thereof and wherein.

DETAILED DESCRIPTION OF THE PREFERRED EMBODIMENTS

Electroless plating of palladium phosphorus includes dissolving a palladium salt and a hypophosphite salt ($PO2^{-3}$) into water or another liquid and then inserting a base metal to be coated. The hypophosphite salt acts as the reducing agent in the mixture. When the hypophosphite salt is exposed to a catalyst (typically the base metal or a film thereon), a reaction begins between the catalyst and the hypophosphite salt whereby the hypophosphite salt donates electrons, resulting in the dissolved palladium precipitating, or plating, on the base metal. Suitable catalysts for hypophosphite include nickel, palladium, and cobalt. Copper, however, is a catalytic poison, preventing the reaction (thus the plating), from occurring.

For this reason, it has been believed that electroless plating is an unsuitable method for plating palladium phosphorus onto copper. However, after extensive effort, it has been discovered that the hypophosphite will react with the palladium when the bath includes ethylene diamine tetraacetic acid (EDTA) mixed with the palladium and hypophosphite. The use of EDTA in an electroless plating bath of palladium and hypophosphite allows the direct plating of palladium onto copper.

Figure 1:
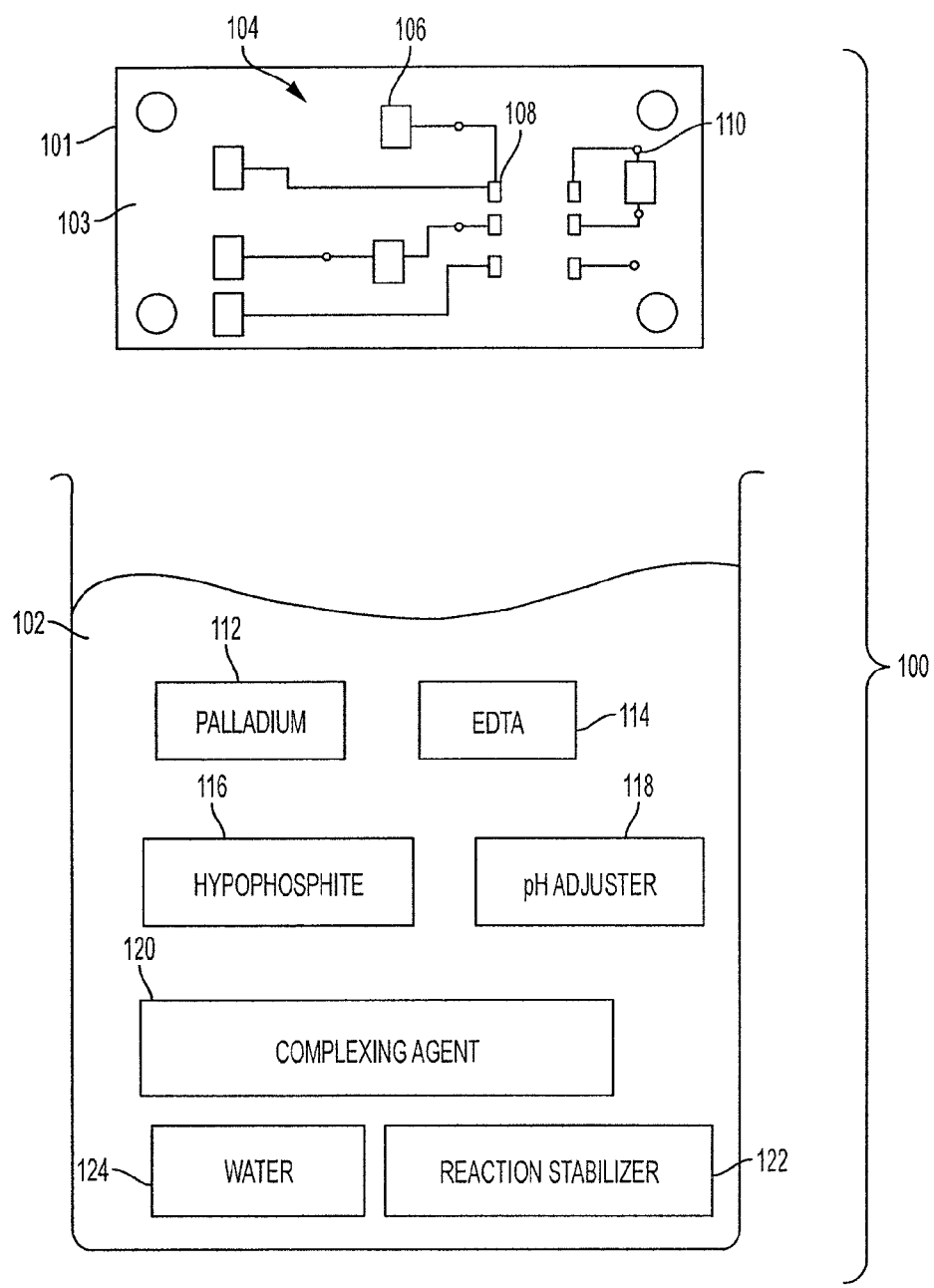
FIG. 1 is a step diagram of a system for plating palladium onto copper including a suitable bath and a printed circuit board having copper components.

FIG. 1 illustrates a system 100 for electroless plating of palladium directly onto copper. The system includes a printed circuit board (PCB) 101 having a substrate 103 and copper components 104, and a bath 102 within which the PCB 101 with copper components 104 is immersed. Although discussion herein is directed to plating of components on a circuit board, one skilled in the art will realize that the bath 102 can be used to electrolessly plate palladium onto any object having one or more copper surfaces, such as an integrated circuit, a switch, an electrical contact, a lead of an electrical component (such as a resistor, capacitor, etc.), or the like. In various embodiments, a bath similar to the bath 102 may also be used to electrolessly plate palladium phosphorus onto copper alloys, nickel, and/or other metals.

The PCB 101 includes the copper components 104 coupled to the substrate 103, which insulates the copper components 104. The copper components may include a pad 106, an electrical contact 108, a through-hole 110, or any other electrical component comprising copper. Each of the copper components 104 have an exposed copper surface to which palladium is deposited. Some of the copper components 104 may be electrically connected together, such as the pad 106 and the electrical contact 108, and others may be insulated from each other, such as the pad 106 and the through-hole 110.

The bath 102 preferably includes a mixture of palladium 112, EDTA 114, hypophosphite 116, a pH adjuster 118, a complexing agent 120, a reaction stabilizer 122, and water 124. The palladium 112 may include a soluble palladium compound, such as a palladium salt or a derivative thereof. For example, the palladium 112 may include palladium sulfate, palladium chloride, palladium acetate or palladium tetraamine sulfate. Palladium tetraamine sulfate is the preferred palladium 112. A suitable concentration of the palladium 112 is between 0.2 grams per liter (g/l) and 2 g/l, with a preferred concentration of about 1 g/l. When used in this context, "about" refers to the referenced value +/−30 percent (%) of the referenced value or +/−40% of the referenced value. The electroless plating of palladium will also occur if the concentration of palladium 112 is above 2 g/l; however, palladium 112 is a precious metal so costs increase as the concentration of palladium 112 increases.

The hypophosphite 116 may include any soluble hypophosphite or derivate thereof, such as a hypophosphite salt. For example, the hypophosphite 116 may include sodium hypophosphite, potassium hypophosphite, ammonium hypophosphite, lithium hypophosphite, magnesium hypophosphite, calcium hypophosphite, the triprotinated acid form of hypophosphite, and/or any derivate of the above. Sodium hypophosphite is preferred. A suitable concentration of the hypophosphite 116 is between 1 g/l and 10 g/l, with a preferred concentration of about 5 g/l. Concentrations of hypophosphite 116 less than 1 g/l and/or greater than 10 g/l may also render the bath 102 suitable for the plating.

The EDTA 114 can include any water soluble polyaminocarboxylic compound, such as diethylene triamine pentaacetic acid, N-(Hydroxyethyl)-ethylenediamine triactetic acid and nitrilotriacteic acid; however. EDTA 114 is typically preferred and may be disodium EDTA, which is the preferred EDTA 114. A suitable range for the concentration of the EDTA 114 is between 1 g/l and 20 g/l, with a preferred concentration of about 2 g/l. Concentrations of the EDTA 114 less than 1 g/l and/or greater than 20 g/l may also render the bath 102 suitable for the plating.

The pH adjuster 118 can be any compound usable to adjust the pH of the bath 102. In some embodiments, the pH adjuster 118 may also function as the complexing agent 120. Alternatively, a separate additional complexing agent 120 may be added to the bath 102. Preferred pH adjusters include sulfuric acid as the acid and ammonium hydroxide as the alkaline. A preferred complexing agent 120 includes ethylene diamine. The ethylene diamine is an alkali and may be used as both the pH adjuster 118 and the complexing agent 120. A suitable range of the pH adjuster 118/complexing agent 120 is between 1 g/l and 20 g/l, with a preferred concentration of the pH adjuster 118/complexing agent 120 being about 2 g/l. Concentrations of the pH adjuster 118/complexing agent 120 less than 1 g/l and/or greater than 20 g/l may also render the bath 102 suitable for the plating.

It is desirable for the bath 102 to have a pH between 5 and 10. It has been discovered that a preferred pH is between 7.4 and 9. In order to set the pH of the bath 102, pH adjuster(s) 118 are added to the bath 102.

The reaction stabilizer 122 may include any compound usable to stabilize the bath 102. For example, the reaction stabilizer 122 can include one or more of lead, tin, indium, bismuth, cadmium, selenium, antimony, arsenic, copper, nickel, tellurium, phosphite, iodide, iodate, bromide, bromate, nitrate, or nitrite. The reaction stabilizer 122 is used to inhibit the catalyst from promoting the reaction and developing solid palladium prior to immersion of the PCB 101.

A preferred reaction stabilizer includes phosphite, nitrate, copper, lead, and bismuth. The phosphite may have a concentration between 0.1 g/l and 5 g/l, with a preferred concentration of about 1 g/l. The nitrate may have a concentration between 0.1 g/l and 5 g/l, with a preferred concentration of about 1 g/l. The copper may have a concentration between 0.1 milligram per liter (mg/l) and 10 mg/l, with a preferred concentration of about 4 mg/l. The bismuth may have a concentration between 0.1 mg/l and 10 mg/l, with a preferred concentration of about 4 mg/l. The lead may have a concentration between about 0.1 mg/l and 5 mg/l, with a preferred concentration of about 0.75 mg/l.

Figure 2:
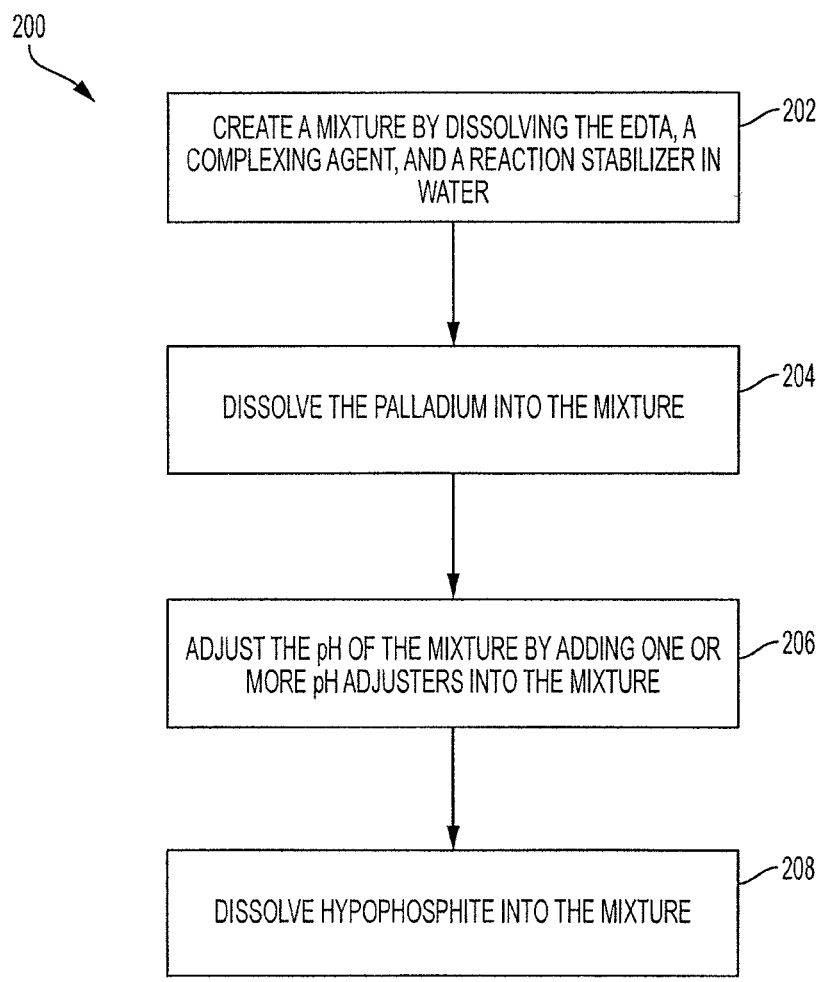
FIG. 2 is a diagrammatic illustration of forming the bath used in the system of FIG. 1.

With reference to FIGS. 1 and 2, a preferred method 200 for forming the bath 102 of FIG. 1 is shown. One skilled in the art will realize that the method 200 is not limited to the order of the steps shown in FIG. 2. In step 202, a mixture is created by dissolving the EDTA 114 and the reaction stabilizer 122 into the water 124. By including the reaction stabilizer 122 in the bath 102 prior to the palladium 112, the palladium 112 is prevented from premature reactions.

In step 204, the palladium 112 is dissolved into the mixture formed in step 202. In step 206, the pH of the mixture is adjusted by adding one or more pH adjusters 118 to the mixture. In a preferred embodiment, the pH adjuster 118 and the complexing agent 120 may be the same compound and can be dissolved in either step 202 or step 206. In step 208, the hypophosphite 116 is added to the mixture, completing the bath 102.

The water 124 is heated to a temperature between 100 degrees Fahrenheit (100° F.) and 150° F., preferably about 120° F., prior to insertion of any components or after one or more components have been added. This provides benefits over other plating methods which usually require more heat. For example, electroless plating of nickel typically operates at about 190° F. Over time, a greater energy cost is incurred at such a high temperature.

Figure 3:
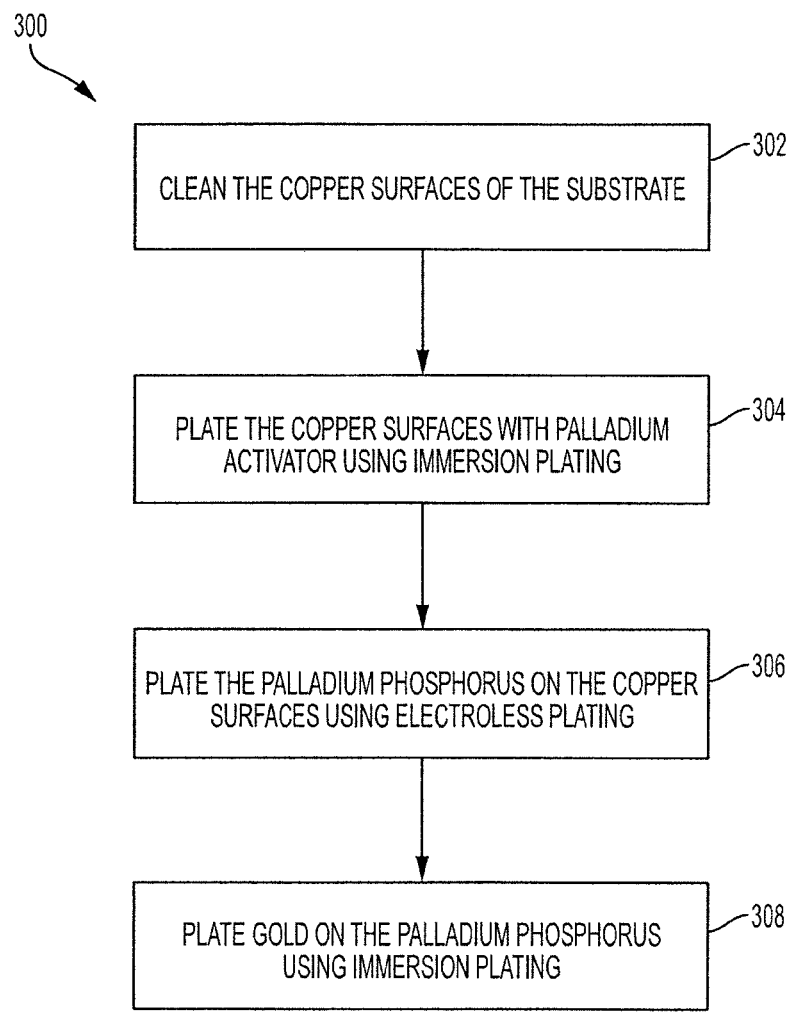
FIG. 3 is a diagrammatic illustration of a method of plating palladium directly on copper, according to the present invention.

With reference now to FIGS. 1 and 3, a preferred method 300 for plating the copper components 104 is shown. In step 302, the surfaces of copper components 104 are cleaned. For example, the PCB 101 may be immersed into a cleaner for a period of time. The cleaner will provide detergency for removing any contaminants from the surfaces of the copper components 104. The cleaner may include commercial cleaners and preferably includes an acidic cleaner.

In step 304, the surfaces of the copper components 104 are plated with a palladium activator, such as a discrete film of palladium. The palladium activator is preferably a non-halogen activator. The palladium activator is the initial catalyst in the electroless plating reaction. Stated differently, the palladium activator allows the surfaces of the copper components 104 to react with the hypophosphite 116 and become plated. Preferably, the palladium activator is plated on the copper by immersion plating, however, other methods may be used to plate the palladium activator on the copper.

In step 306, palladium is plated on the surfaces of the copper components 104. The plating is accomplished by submerging the PCB 101 into the bath 102 for a predetermined amount of time. Initially, the hypophosphite 116 reacts with the palladium activator, allowing the palladium 112 to plate the surfaces of the copper components 104. After a first layer of palladium is plated on the copper surfaces, the palladium continues to react with the hypophosphite 116, causing additional palladium 112 to plate on the copper components 104.

The reaction will continue to occur until either the PCB 101 is removed from the bath 102 or no more palladium 112 exists in the bath 102. The thickness of the palladium layer is controlled by submerging the PCB 101 in the bath 102 until the palladium is at the desired thickness. While a variety of thicknesses can be achieved, the desired thickness is between 0.01 micrometers ($\mu$m) and 2 $\mu$m.

In optional step 308, gold may be plated onto the palladium layer using an immersion method. Alternatively, silver may be plated, instead of, or in addition to, the gold. The gold may be applied at a thickness of between 0.01 $\mu$m and 0.1 $\mu$m. Because of the nature of immersion plating, it is difficult to achieve a gold layer having a thickness much greater than 0.1 $\mu$m. In some embodiments the gold or silver may be plated using other methods such as electroless plating, thus allowing the gold and/or sliver layers to have a thickness beyond this range.

Figure 4:
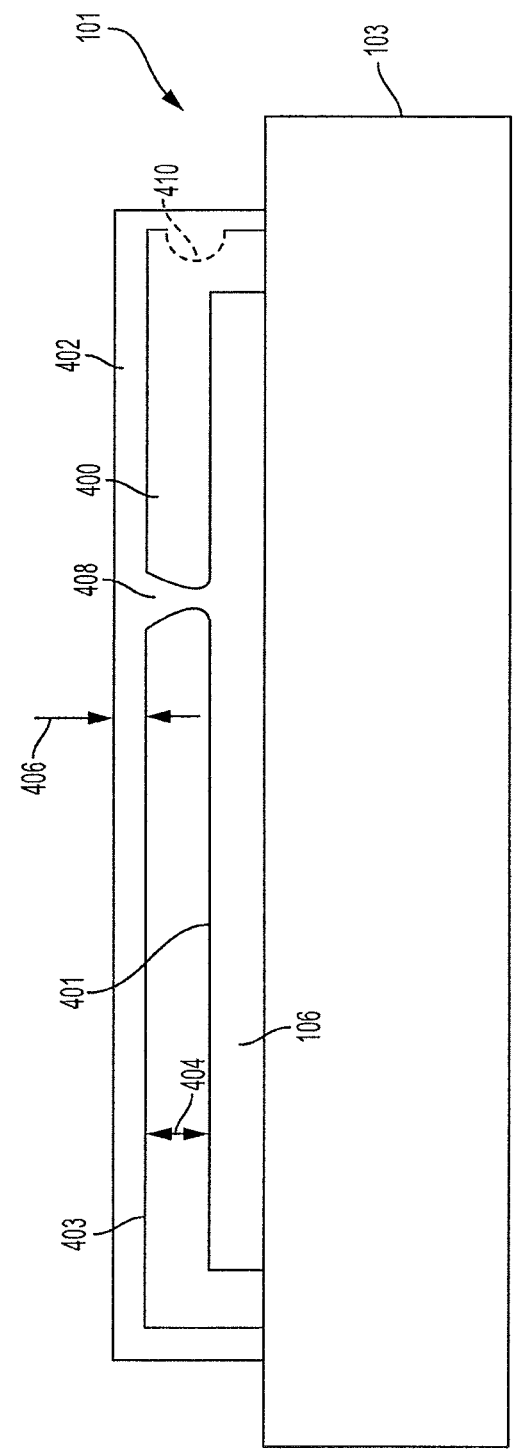
FIG. 4 illustrates a copper component with palladium plated directly on the copper and gold plated directly on the palladium layer.

With reference to FIG. 4, the pad 106 of the PCB 101 has a palladium layer 400 and a gold layer 402. The pad 106 includes copper portions that may be printed on, or otherwise coupled to, the insulating substrate 103. The pad 106 also includes a surface 401 that was exposed prior to the plating process. Palladium may be plated directly on the pad 106. That is, the palladium is plated on the surface 401 directly, without other metals therebetween, using a method similar to the method 300 of FIG. 3. The palladium layer 400 may have a thickness 404 that is between 0.01 $\mu$m and 2 $\mu$m.

In other preferred embodiments, the palladium layer 400 may include one or more transverse pores 408 (i.e., pores extending through the palladium layer 400) and/or one or more masked or bridged pores 410 (i.e., pores that do not extend through the palladium layer 400). Accordingly, the palladium layer 400 may have a porosity value that represents the percentage of the volume of the pores 408, 410 compared to the total volume of the palladium layer 400 (including the volume of the pores 408, 410). Porosity as used herein may be calculated using: the void caused by the transverse pores 408 only, the void caused by the transverse pores 408 and the masked or bridged pores 410, or a combination of these two methods. Plating palladium phosphorus using the method 200 of FIG. 2 with a polyaminocarboxylic compound will result in a layer of palladium having a lower porosity value than a palladium layer electrolessly plated using a method that does not include polyaminocarboxylic compound using any method for calculating porosity.

This relatively low porosity value provides several advantages. If the porosity of a plated layer is too great, materials on either side of the layer may undesirably react with one another. For example, if the porosity of the palladium layer 400 is above a predetermined value, the copper of the pad 106 may react with the gold layer 402, allowing corrosion of the pad 106 and/or the gold layer 402. Plating of palladium onto copper, prior to the present invention, resulted in a porosity that was too great, and allowing the gold layer to corrode relatively quickly.

The palladium layer 400 may have gold plated on its surface 403 using immersion plating. The gold plating 402 may have a thickness 406 of between 0.01 $\mu$m and 0.1 $\mu$m. The gold plating 402 increases the suitability of the pad 106 for soldering and gold wire bonding. Greater gold thicknesses are possible using an electroless gold plating method.

The pad 106 with the palladium layer 400 and the gold layer 402 provides advantages over components having a plated nickel layer, a palladium layer, and a gold layer. For instance, nickel has magnetic properties which will interfere with high frequency signals. Elimination of nickel plating from the pad 106 reduces this problem of interference with high frequency signals passing through the pad 106.

Components having nickel, palladium, and gold layers have a greater thickness than pad 106 because of the additional layer and the greater thickness of the nickel layer. Additional thickness is generally undesirable, especially so for particular applications. For example, a flexible PCB, such as a printed cable, is occasionally flexed. Due to the thickness of traditional plating (and the relatively low malleability of nickel), this flexing can result in cracking of the nickel layer. However, the reduced thickness of the combination of the palladium layer 400 and the gold layer 402 (and the greater malleability of palladium and gold) reduce the likelihood of cracking due to flexure. Additionally, electrical components are constantly being redesigned to have a smaller footprint. For example, some components previously sized at about 50+µm and spaced apart by about 50+µm may now be sized at about 15 µm and spaced apart by about 15 µm. The lesser thickness of the plating layers of the pad 106 allows plating of smaller components. This is not so for plated layers of nickel, palladium, and gold.

Using the method 300 of FIG. 3, the inventors cleaned exposed copper surfaces of a PCB by submersion in an acid cleaner. A palladium activator was then plated on the copper parts of the PCB using immersion plating. A bath including palladium tetraamine sulfate at a concentration of 1 g/l, sodium hypophosphite at 5 g/l, disodium EDTA at 2 g/l, ethylene diamine at 2 g/l, and reaction stabilizers including phosphite at 1 g/l, nitrate at 1 g/l, copper at 4 mg/l, bismuth at 4 mg/l, and lead at 0.75 g/l was prepared. The bath had a pH of 9.0 and was heated to 120° F. The PCB with the cleaned copper surfaces and the palladium activator was submerged in the bath. Measurements taken showed that the palladium plated onto the copper surfaces at the rate of about 0.025 µm per minute. The PCB was submerged in the bath for a total of 40 minutes. When removed, the copper of the PCB had an evenly distributed palladium layer at 1 µm thick.

To determine the impact of EDTA in the plating process, the inventor conducted the following experiment. The PCB having exposed copper surfaces was cleaned using the same type of acid cleaner as used in the above process. The copper was immersion plated with a palladium activator. A bath having the same concentrations of all ingredients of the above process was prepared. However, this bath did not include any EDTA. The bath had a pH of 9.0 and was heated to a temperature of 120° F. The PCB was submerged in the bath for 40 minutes. After the 40 minutes, the copper surfaces on the PCB were still clearly visible. The palladium did not plate the copper unfailingly because the bath did not have any EDTA, a critical element of this invention.

Exemplary embodiments of the bath, methods, and plated component have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed.

What is claimed is:

1. A method for electroless plating of palladium onto a copper surface of a component, comprising:
    preparing a bath having a palladium compound;
    a poly aminocarboxylic compound;
    hypophosphite or a derivative thereof
    a pH adjuster;
    a complexing agent;
    a reaction stabilizing mixture of phosphite at a concentration between 0.1 grams per liter (g/l) and 5 g/l, nitrite at a concentration between 0.1 g/l and 5 g/l, copper at a concentration between 0.1 milligrams per liter (mg/l) and 10 mg/l, bismuth at a concentration between 0.1 mg/l and 10 mg/l, and lead at a concentration between 0.1 mg/l and 5 mg/l; and
    submerging the component in the bath to plate palladium directly on the copper surface of the component.

2. The method of claim 1, wherein the palladium compound is present in the bath at a concentration between 0.2 grams per liter (g/l) and 2 g/l and the polyaminocarboxylic compound includes at least one of an ethylene diamine tetraacetic acid (EDTA) or a derivative thereof at a concentration between 1 g/l and 20 g/l.

3. The method of claim 1, wherein preparing the bath includes:
    dissolving the polyaminocarboxylic compound and the reaction stabilizer in water to create a mixture;
    dissolving the palladium compound in the mixture;
    adjusting pH of the mixture by dissolving the pH adjuster into the mixture; and
    dissolving the hypophosphite or a derivative thereof in the mixture.

4. The method of claim 3, wherein the pH of the mixture is adjusted to be between 5.0 and 10.0.

5. The method of claim 1, further comprising cleaning the copper surface of the component to be plated by palladium; and
    applying a palladium activator to the copper surface of the component.

6. The method of claim 1, further comprising plating a gold layer on the plated palladium layer using immersion or electroless plating.

7. The method of claim 1, further comprising plating a silver layer on the plated palladium layer using immersion or electroless plating.

8. The method of claim 1, further comprising keeping the copper surface of the component submerged in the bath until the palladium layer has a thickness between 0.01 micrometers (µm) and 2 µm.

9. The method of claim 1, wherein the polyaminocarboxylic compound includes ethylene diamine tetraacetic acid (EDTA) or a derivative thereof at a concentration between 1 g/l and 20 g/l.

10. The method of claim 1, wherein the pH adjuster and the complexing agent are the same and include ethylene diamine.

11. The method of claim 1, wherein the complexing agent is at a concentration between 1 g/l and 20 g/l.

12. The method of claim 1, wherein the palladium compound includes at least one of a palladium sulfate, a derivative of palladium sulfate, a palladium chloride, a derivative of palladium chloride, palladium acetate, a derivative of palladium acetate, palladium tetramine sulfate or a derivative of palladium tetramine sulfate.

13. A component having a copper surface with a palladium layer plated directly thereon by a method comprising:
    preparing a bath having a palladium compound;
    a polyaminocarboxylic compound;
    hypophosphite or a derivative thereof
    a pH adjuster;
    a complexing agent;

a reaction stabilizing mixture of phosphite at a concentration between 0.1 grams per liter (g/l) and 5 g/l, nitrite at a concentration between 0.1 g/l and 5 g/l, copper at a concentration between 0.1 milligrams per liter (mg/l) and 10 mg/l, bismuth at a concentration between 0.1 mg/l and 10 mg/l, and lead at a concentration between 0.1 mg/l and 5 mg/l; and submerging the component in the bath to plate palladium directly on the copper surface of the component.

14. The component of claim 13, wherein the palladium compound was present in the bath at a concentration between 0.2 grams per liter (g/l) and 2 g/l and the polyaminocarboxylic compound includes at least one of an ethylene diamine tetraacetic acid (EDTA) or a derivative thereof at a concentration between 1 g/l and 20 g/l.

15. The component of claim 13, wherein preparing the bath includes:

dissolving the polyaminocarboxylic compound and the reaction stabilizer in water to create a mixture;

dissolving the palladium compound in the mixture;

adjusting pH of the mixture by dissolving the pH adjuster into the mixture; and dissolving the hypophosphite or a derivative thereof in the mixture.

16. The component of claim 13, further comprising a layer of gold or silver plated on the palladium layer by immersion or electroless plating.

\* \* \* \* \*